United States Patent
Jiang et al.

(10) Patent No.: US 11,888,482 B2
(45) Date of Patent: Jan. 30, 2024

(54) HYBRID HYSTERETIC CONTROL SYSTEM

(71) Applicant: TEXAS INSTRUMENTS INCORPORATED, Dallas, TX (US)

(72) Inventors: Chen Jiang, Houston, TX (US); Shamim Choudhury, Katy, TX (US); Subrahmanya Bharathi Akondy, Cypress, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/565,110

(22) Filed: Dec. 29, 2021

(65) Prior Publication Data

US 2023/0208403 A1 Jun. 29, 2023

(51) Int. Cl.
| | |
|---|---|
| *H03K 3/00* | (2006.01) |
| *H03K 3/017* | (2006.01) |
| *H03K 3/023* | (2006.01) |
| *H03K 4/08* | (2006.01) |
| *H03K 17/56* | (2006.01) |

(52) U.S. Cl.
CPC ............. *H03K 3/017* (2013.01); *H03K 3/023* (2013.01); *H03K 4/08* (2013.01); *H03K 17/56* (2013.01)

(58) Field of Classification Search
CPC .......... H03K 3/017; H03K 3/023; H03K 4/08; H03K 7/08; H03K 17/56
See application file for complete search history.

(56) References Cited

U.S. PATENT DOCUMENTS

| | | | |
|---|---|---|---|
| 8,319,570 B2 | 11/2012 | Wilson | |
| 10,128,757 B2* | 11/2018 | Unno | .................. H02M 3/1582 |
| 10,312,806 B1* | 6/2019 | Chen | ..................... H02M 3/158 |
| 10,355,596 B2* | 7/2019 | Choquet | ............... H02M 3/158 |
| 10,404,173 B1* | 9/2019 | de Cremoux | ....... H02M 3/1582 |
| 10,644,600 B2* | 5/2020 | Wu | ...................... H02M 3/1563 |
| 2007/0212596 A1* | 9/2007 | Nebrigic | ............... H01M 10/42 |
| | | | 429/61 |

(Continued)

OTHER PUBLICATIONS

"Basic Comparator: MT-083 Tutorial Comparators," https://www.analog.com/media/en/training-seminars/tutorials/MT-083.pdf, Sep. 30, 2011, 7 pages.

(Continued)

*Primary Examiner* — Tuan T Lam (74) *Attorney, Agent, or Firm* — Brian D. Graham; Frank D. Cimino (57) ABSTRACT

A system comprises a first comparator, a second comparator, a pulse-width modulation (PWM) controller, and a ramp generator. The first comparator has a positive input coupled to a first ramp output of the ramp generator and a negative input configured to receive an input voltage. The second comparator has a positive input configured to receive the input voltage and a negative input coupled to a second ramp output of the ramp generator. The PWM controller is coupled to outputs and control signal inputs of the first and second comparators and has a control output. In some implementations, the ramp generator generates a high-side falling ramp for the first comparator and a low-side rising ramp for the second comparator. In some implementations, the ramp generator includes a first ramp generator for the high-side falling ramp and a second ramp for the low-side rising ramp.

21 Claims, 5 Drawing Sheets

(56) References Cited

U.S. PATENT DOCUMENTS

| | | | | |
|---|---|---|---|---|
| 2010/0231189 A1* | 9/2010 | Chen | .................... | H02M 3/1582 |
| | | | | 323/284 |
| 2011/0227550 A1* | 9/2011 | Walters | ............... | H02M 3/1582 |
| | | | | 323/283 |
| 2016/0190931 A1* | 6/2016 | Zhang | ................. | H02M 3/1582 |
| | | | | 323/271 |
| 2016/0352228 A1* | 12/2016 | Zhang | ..................... | H02M 1/32 |
| 2018/0048232 A1* | 2/2018 | Adell | .................... | H02M 3/157 |
| 2018/0048236 A1* | 2/2018 | Wang | ................ | H02M 3/33507 |
| 2022/0045603 A1* | 2/2022 | Giombanco | ............ | H02M 1/36 |

OTHER PUBLICATIONS

Yang, R., et al., "Investigation on the Small Signal Charateristics Based on the LLC Hybrid Hysteretic Charge Control," CPSS Transactions on Power Electronics and Applications, vol. 4, No. 2, https://tpea.cpss.org.cn/uploads/allimg/190627/10.24295CPSSTPEA, Jun. 1, 2019, pp. 128-142.

Extended European Search Report dated May 12, 2023, European Application No. 22216664.7, 12 pages.

* cited by examiner

HYBRID HYSTERETIC CONTROL SYSTEM

BACKGROUND

Hybrid hysteretic control (HHC) systems are used to improve the transient response of power supply units by simplifying the compensation into a first order system. Two-sided HHC provides faster transient response times than one-sided HHC, but is implemented with an external comparator and ramp generator, increasing the area occupied by the HHC system on the integrated circuit including the HHC system and the power converter. In addition, unavoidable differences between the two feedback signal chains can introduce imbalance and asymmetry in the resulting pulse width modulation control signals.

SUMMARY

A system comprises a first comparator, a second comparator, a pulse-width modulation (PWM) controller, and a ramp generator. The first comparator has a positive input coupled to a first ramp output of the ramp generator and a negative input configured to receive an input voltage. The second comparator has a positive input configured to receive the input voltage and a negative input coupled to a second ramp output of the ramp generator. The PWM controller is coupled to outputs and control signal inputs of the first and second comparators and has a control output.

In some implementations, the ramp generator generates a first ramp for the first comparator and a second ramp for the second comparator. The first ramp can be a high-side falling ramp, and the second ramp can be a low-side rising ramp. In some implementations, the ramp generator includes a first ramp generator for the high-side falling ramp and a second ramp for the low-side rising ramp. The first and second ramps are offset by half a period T.

In some implementations, a voltage sensing circuit provides the input voltage. The input voltage is a first input voltage in some implementations, and the control output of the PWM comprises a first control output and a second control output. The system also includes a first transistor, a second transistor, a third transistor, a fourth transistor, a capacitor, an inductor, and a transformer. The first transistor has a first control terminal coupled to the first control output and first and second current terminals. The second transistor has a second control terminal coupled to the second control output and third and fourth current terminals. The third current terminal is coupled to the second current terminal, and the first and fourth current terminals receive a second input voltage.

The capacitor has a first capacitor terminal coupled to the fourth current terminal and a second capacitor terminal. The voltage sensing circuit measures the first input voltage across the capacitor. The inductor has a first inductor terminal coupled to the second and third current terminals and a second inductor terminal. The transformer has a first input coupled to the second inductor terminal and a second input coupled to the second capacitor terminal. The transformer also has three transformer outputs.

The third transistor has a third control terminal configured to receive a biasing voltage, a fifth current terminal coupled to the first transformer output, and a sixth current terminal. The fourth transistor has a fourth control terminal configured to receive the biasing voltage, a seventh current terminal coupled to the second transformer output, and an eighth current terminal coupled to the sixth current terminal. In some implementations, the transformer is a center-tap transformer.

BRIEF DESCRIPTION OF THE DRAWINGS

For a detailed description of various examples, reference will now be made to the accompanying drawings in which.

The same reference number is used in the drawings for the same or similar (either by function and/or structure) features.

DETAILED DESCRIPTION

The described digital two-sided hybrid hysteretic control (HHC) systems include two comparators, two ramp generators, and a pulse-width modulation (PWM) controller. Each comparator has a positive input, a negative input, a control input, and an output. In the first comparator, the positive input receives a high-side falling ramp from a ramp generator, and the negative input receives a voltage across a resonant capacitor in a power converter. The control input receives a first feedback signal from the PWM controller. In the second comparator, the positive input receives the voltage across the resonant capacitor, and the negative input receives a low-side rising ramp from the other ramp generator. The control input receives a second feedback signal from the PWM controller, which generates first and second control signals for the power converter based on the outputs of the first and second comparators. The digital two-sided HHC systems are integrated into a single semiconductor die and use both rising and falling ramps, instead of a falling ramp only.

Figure 1A:
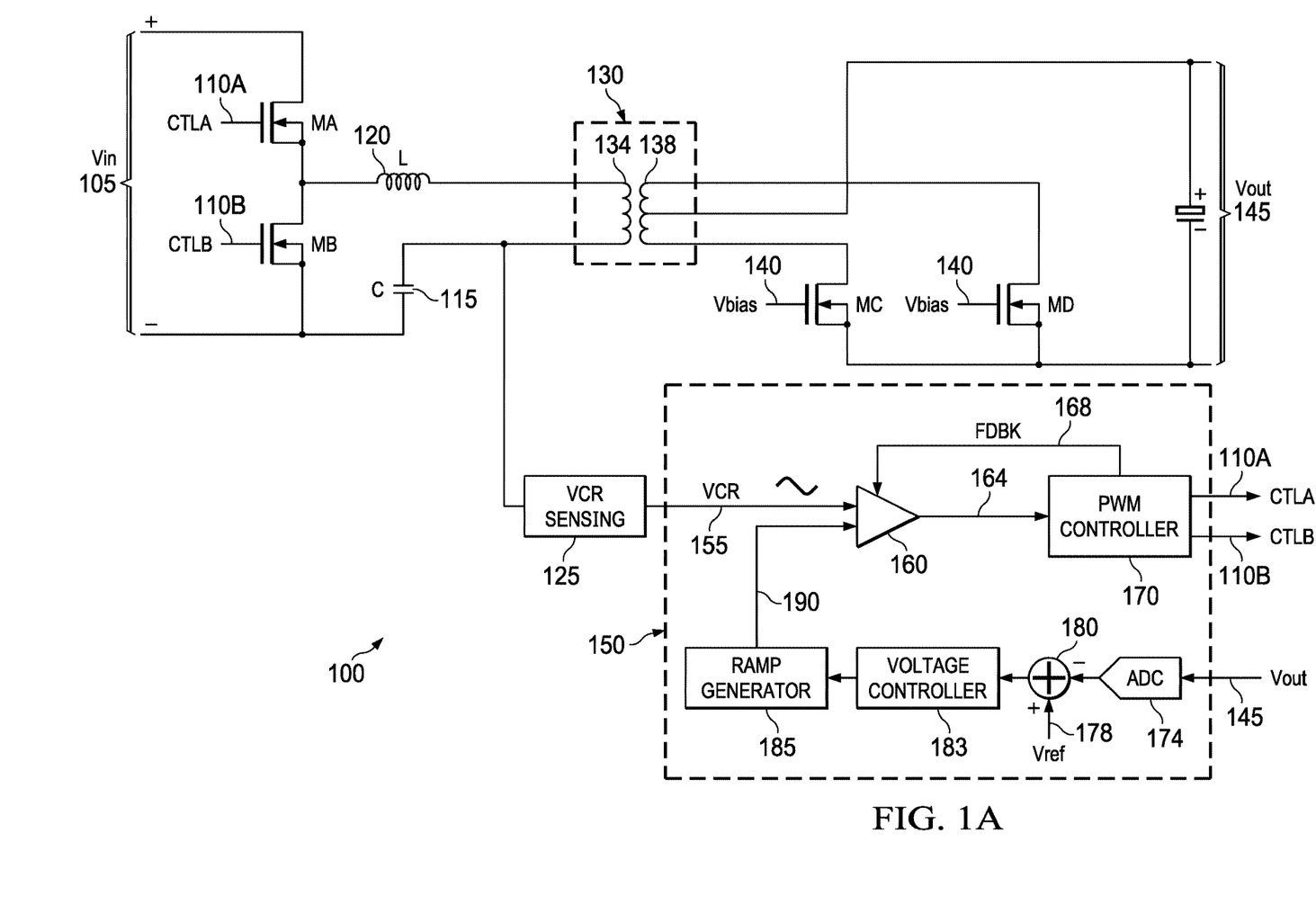
FIG. 1A shows a block diagram of an example LLC converter and corresponding one-sided hybrid hysteretic control (HHC) system.

FIG. 1A shows a block diagram of an example LLC converter 100 and corresponding one-sided hybrid hysteretic control (HHC) system 150. The LLC converter 100 includes transistors MA, MB, MC, and MD; resonant capacitor C 115, inductor L 120, transformer 130, voltage sensing circuit 125, and the one-sided HHC system 150. The voltage sensing circuit 125 is configured to measure the voltage across the resonant capacitor C 115. In some implementations, the transformer 130 is a center-tap transformer. The one-sided HHC system 150 includes a comparator 160, a pulse-width modulation (PWM) controller 170, an analog-to-digital converter (ADC) 174, an adder 180, and a ramp generator 185.

The transistors MA, MB, MC, and MD may be metal oxide semiconductor field-effect transistors (MOSFETs). Accordingly, MA-MD are n-type MOSFETs (NMOS) in an example. In other examples, one or more of MA-MD are p-type MOSFETs (PMOS) or bipolar junction transistors (BJTs). A BJT includes a base corresponding to the gate terminal of a MOSFET, and a collector and an emitter corresponding to the drain and source terminals of a MOSFET. The base of a BJT and the gate terminal of a MOSFET are also called control inputs. The collector and emitter of a BJT and the drain and source terminals of a MOSFET are also called current terminals.

The source terminal of MA and the drain terminal of MB are coupled together, and the input voltage Vin 105 is applied across the drain terminal of MA and the source terminal of MB. The gate terminal of MA is configured to receive the first control signal CTLA 110A, and the gate terminal of MB is configured to receive the second control signal CTLB 110B. The inductor L 120 has a first terminal coupled to the source terminal of MA and the drain terminal of MB and a second terminal coupled to the transformer 130. The resonant capacitor C 115 has a first terminal coupled to the source terminal of MB and a second terminal coupled to the transformer 130. The voltage sensing circuit 125 is coupled to the second terminal of the resonant capacitor C 115 and measures the voltage VCR 155 across the resonant capacitor C 115.

The transformer 130 includes a primary winding 134 and a secondary winding 138. The second terminal of the inductor L 120 is coupled to a first terminal of the primary winding 134, and the second terminal of the resonant capacitor C 115 is coupled to a second terminal of the primary winding 134. A first terminal of the secondary winding 138 is coupled to the drain terminal of MD, and a second terminal of the secondary winding 138 is coupled to the drain terminal of MC. The source terminals of MC and MD are coupled together, and the gate terminals of MC and MD are configured to receive a biasing voltage Vbias 140. The output voltage Vout 145 is taken across the center tap of transformer 130 and the source terminals of MC and MD.

In the one-sided HHC system 150, the comparator 160 has a first input configured to receive the voltage VCR 155 across the resonant capacitor C 115 from the voltage sensing circuit 125, and a second input coupled to an output of the ramp generator 185 to receive the ramp 190. The comparator 160 is also configured to receive a feedback signal FDBK 168 from the PWM controller 170, which resets a digital-to-analog converter (DAC) of the comparator 160 to support HHC. The output 164 of comparator 160 is provided to the PWM controller 170, which outputs the control signals CTLA 110A and CTLB 110B for transistors MA and MB, respectively, as well as the feedback signal FDBK 168 for the comparator 160. The ADC 174 receives the output voltage Vout 145, and adder 180 subtracts the output of the ADC 174 from a reference signal Vref 178, which represents the target output voltage. A voltage controller 183 receives the difference between the target output voltage represented by Vref 178 and the digitized output voltage from ADC 174, and generates a control signal for the ramp generator 185. The ramp generator 185 receives the control signal from the voltage controller 183 and generates the ramp signal 190. In some implementations, the control signal from the voltage controller 183 indicates the initial value of the ramp signal 190.

Figure 1B:
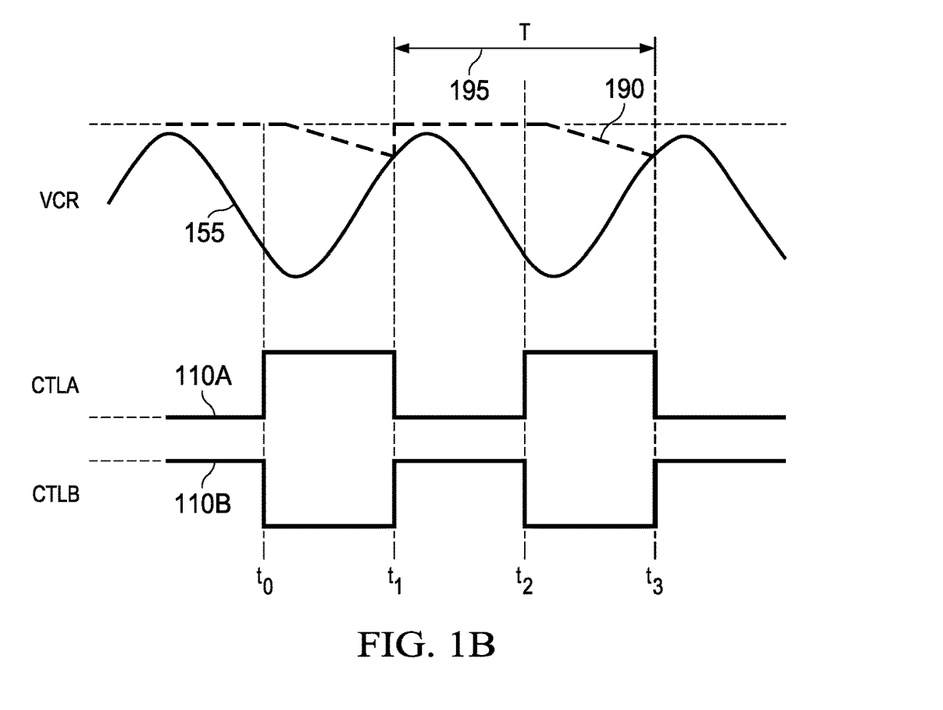
FIG. 1B shows waveforms of signals generated in the one-sided HHC system shown in FIG. 1A.

FIG. 1B shows waveforms of signals generated in the one-sided HHC system 150 shown in FIG. 1A. At time t0, the control signal CTLA 110A transitions from logic low to logic high, and the control signal CTLB 110B transitions from logic high to logic low. The VCR 155 intersects with the ramp signal 190 at time t1, triggering the control signal CTLB 110B to transition from logic low to logic high. CTLB 110B is logic high and CTLA 110A is logic low from time t1 to time t2, at which CTLB 110B transitions to logic low and CTLA 110A transitions to logic high. The length of time between time t0 and t1 while CTLA 110A is logic high is measured, and the time t2 is chosen such that the length of time between t1 and t2 while CTLB 110B is logic low is kept equal to the length of time between t0 and t1. At time t3, the VCR 155 intersects with the ramp 190, and the control signal CTLB 110B transitions from logic low to logic high. The time between t1 and t3 is a period T 195. However, one-sided HHC can have slower transient response times than two-sided HHC, shown in FIG. 2A.

Figure 2A:
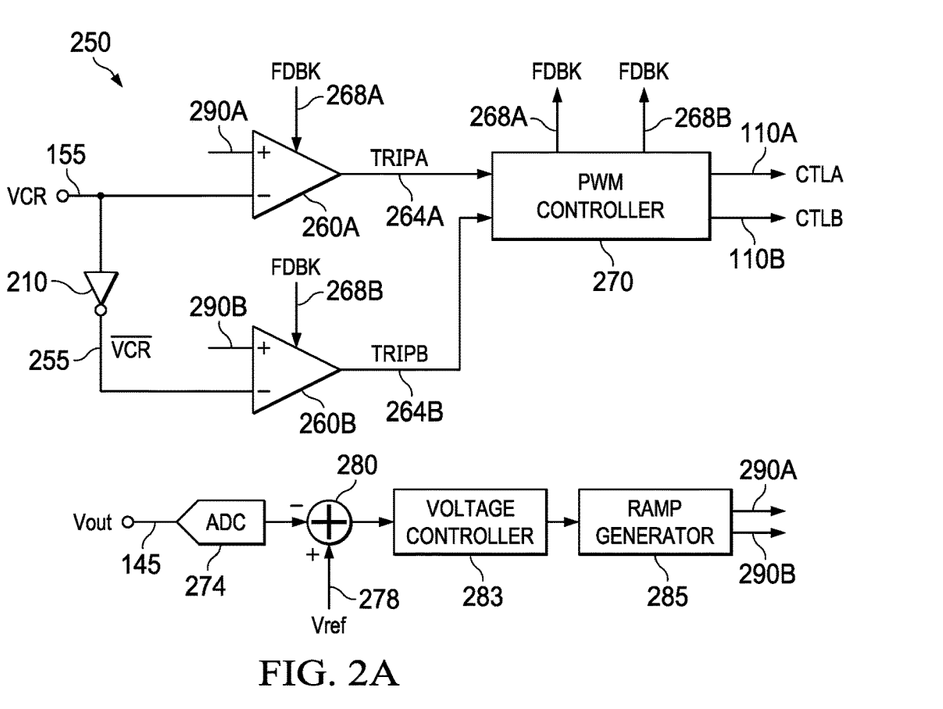
FIG. 2A shows a block diagram of an example two-sided HHC system for the LLC converter shown in FIG. 1A.

FIG. 2A shows a block diagram of an example analog two-sided HHC system 250 that may be used in place of one-sided HHC system 150 in the LLC converter 100 shown in FIG. 1A. For ease of explanation, the analog two-sided HHC system 250 is described herein with respect to the LLC converter shown in FIG. 1A, and includes an inverter 210, two comparators 260A-B, a pulse-width modulation (PWM) controller 270, an ADC 274, an adder 280, and a ramp generator 285. The comparator 260A has a positive input that receives a first ramp 290A from the ramp generator 285 and a negative input that receives the voltage VCR 155 across the resonant capacitor C 115. The comparator 260A also receives a feedback signal FDBK 268A from the PWM controller 270 and generates an output signal TRIPA 264A, which is provided to the PWM controller 270.

The inverter 210 receives the voltage VCR 155 and outputs the inverse, $\overline{VCR}$ 255 to a negative input of comparator 260B. The positive input of comparator 260B receives a second ramp 290B from the ramp generator 285. The comparator 260B also receives a feedback signal FDBK 268B from the PWM controller 270 and generates an output signal TRIPB 264B, which is provided to the PWM controller 270. The PWM controller 270 generates the feedback signals FDBK 268A and 268B for comparator 260A and 260B, respectively, to reset the DACs in comparators 260A and 260B. The PWM controller 270 outputs the control signals CTLA 110A and CTLB 110B for transistors MA and MB, respectively, in the LLC converter 100 shown in FIG. 1A.

Figure 2B:
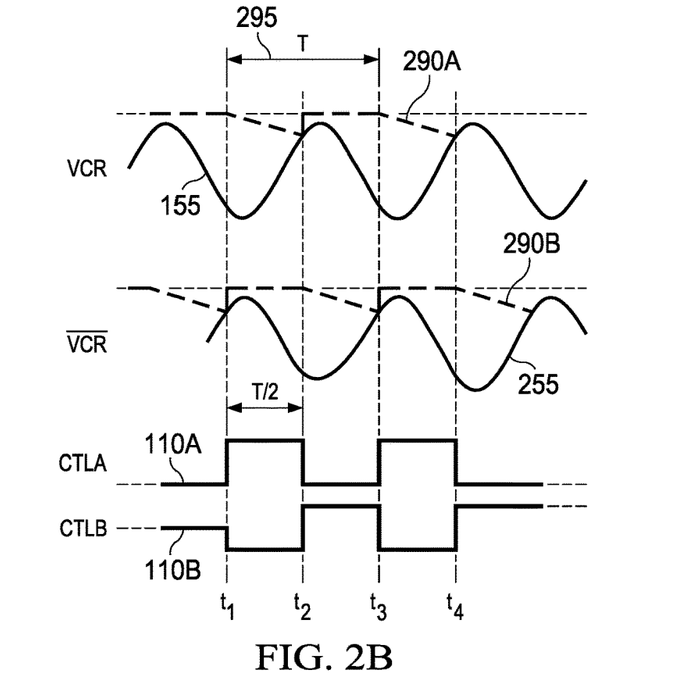
FIG. 2B shows waveforms of signals generated in the two-sided HHC system shown in FIG. 2A.

The ADC 274 receives the output voltage Vout 145, and adder 280 subtracts the output of the ADC 274 from a reference signal Vref 278, which represents the target output voltage. A voltage controller 283 receives the difference between the target output voltage represented by Vref 278 and the digitized output voltage from ADC 274 and generates a control signal for ramp generator 285. The ramp generator 285 receives the control signal from the voltage controller 283 and generates the ramps 290A and 290B for the comparators 260A and 260B, respectively. In some implementations, the control signal from the voltage controller 283 indicates the initial values for ramps 290A and 290B. FIG. 2B shows waveforms of signals generated in the two-sided HHC system 250 shown in FIG. 2A, including the ramp 290A relative to VCR 155, the ramp 290B relative to $\overline{VCR}$ 255, and the control signals CTLA 110A and CTLB 110B.

Ramp 290B is offset from ramp 290A by half a period T 295 of the ramp 290B, and at time t1, $\overline{VCR}$ 255 intersects with ramp 290B, causing CTLB 110B to transition from logic high to logic low and CTLA 110A to transition from logic low to logic high. At time t2, VCR 155 intersects with ramp 290A, causing CTLA 110A to transition from logic high to logic low and CTLB 110B to transition from logic low to logic high. At t3, $\overline{VCR}$ 255 intersects with ramp 290B, causing CTLB 110B to transition from logic high to logic low and CTLA 110A to transition from logic low to logic high.

At time t4, VCR 155 intersects with ramp 290A, causing CTLA 110A to transition from logic high to logic low and CTLB 110B to transition from logic low to logic high. The analog two-sided HHC system 250 offers faster transient response times than one-sided HHC system 150 but utilizes an analog inverter 210 to generate the second feedback signal $\overline{VCR}$ 255, which can introduce error or delays into the resulting output signal TRIPB 264B from comparator 260B. In addition, the ramp generator 285 is external to the integrated circuit including the comparators 260A and 260B and PWM controller 270, occupying additional area.

Figure 3A:
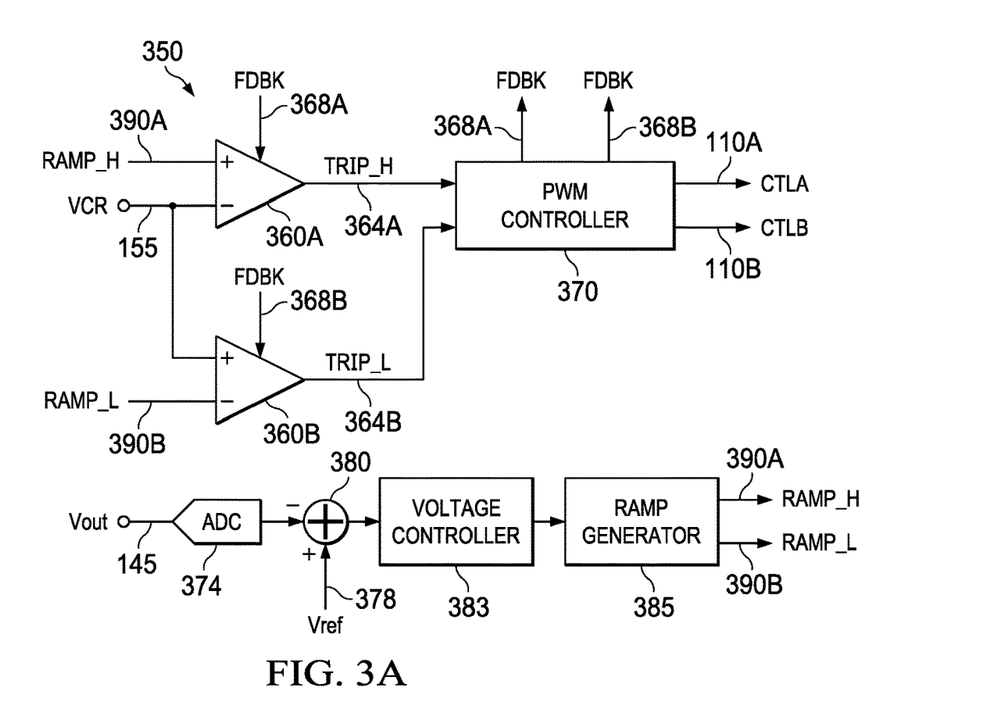
FIG. 3A shows a block diagram of an example two-sided HHC system for the LLC converter shown in FIG. 1A.

FIG. 3A shows a block diagram of an example digital two-sided HHC system 350 that may be used in place of one-sided HHC system 150 in the LLC converter 100 shown in FIG. 1A. For ease of explanation, the digital two-sided HHC system 350 is described herein with respect to the LLC converter 100 shown in FIG. 1A, and includes two comparators 360A-B, a PWM controller 370, an ADC 374, an adder 380, a voltage controller 383, and a ramp generator 385. The comparator 360A has a positive input that receives a high-side falling ramp RAMP_H 390A from the ramp generator 385 and a negative input that receives the voltage VCR 155 across the resonant capacitor C 115. The comparator 360A also receives a feedback signal FDBK 368A from the PWM controller 370 and generates an output signal TRIP_H 364A, which is provided to the PWM controller 370.

The comparator 360B has a positive input that receives the voltage VCR 155 across the resonant capacitor C 115 and a negative input that receives a low-side rising ramp RAMP_L 390B from the ramp generator 385. The comparator 360B also receives a feedback signal FDBK 368B from the PWM controller 370 and generates an output signal TRIP_L 364B, which is provided to the PWM controller 370. The PWM controller 370 generates the feedback signals FDBK 368A and 368B for comparator 360A and 360B, respectively. The PWM controller 370 outputs the control signals CTLA 110A and CTLB 110B for transistors MA and MB, respectively, in the LLC converter 100 shown in FIG. 1A.

The ADC 374 receives the output voltage Vout 145, and adder 380 subtracts the output of the ADC 374 from a reference voltage Vref 378, which represents the target output voltage. A voltage controller 383 receives the difference between the target output voltage represented by Vref 378 and the digitized output voltage from ADC 374, and generates a control signal for the ramp generator 385. The ramp generator 385 receives control signal from the voltage controller 383 and generates the high-side falling ramp RAMP_H 390A and the low-side rising ramp RAMP_L 390B for the comparators 360A and 360B, respectively. In some implementations, the control signal from the voltage controller 383 indicates the initial values of the ramp signals RAMP_H 390A and RAMP_L 390B. The ramp generator 385 uses preset slopes for each of RAMP_H 390A and RAMP_L 390B, and the feedback signals FDBK 368A and 368B reset the comparator DACs in comparator 360A and 360B to cut off the ramps RAMP_H 390A and RAMP_L 390B.

Figure 3B:
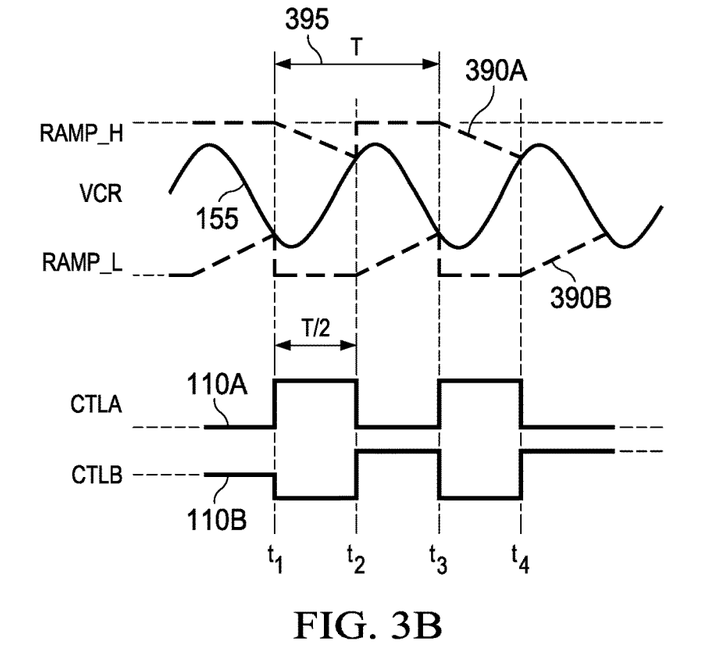
FIG. 3B shows waveforms of signals generated in the two-sided HHC system shown in FIG. 3A.

FIG. 3B shows waveforms of signals generated in the digital two-sided HHC system 350 shown in FIG. 3A, including the high-side ramp RAMP_H 390A and the low-side ramp RAMP_L 390B relative to VCR 155, and the control signals CTLA 110A and CTLB 110B. The low-side ramp RAMP_L 390B is offset from the high-side ramp RAMP_H 390A by half a period T 395 of the ramps 390A and 390B, and at time t1, VCR 155 intersects with low-side ramp RAMP_L 390B, causing CTLB 110B to transition from logic high to logic low and CTLA 110A to transition from logic low to logic high. At time t2, VCR 155 intersects with high-side ramp RAMP_H 390A, causing CTLA 110A to transition from logic high to logic low, and CTLB 110B to transition from logic low to logic high. At time t3, VCR 155 intersects with low-side ramp RAMP_L 390B, causing CTLB 110B to transition from logic high to logic low and CTLA 110A to transition from logic low to logic high. At time t4, VCR 155 intersects with high-side ramp RAMP_H 390A, causing CTLA 110A to transition from logic high to logic low, and CTLB 110B to transition from logic low to logic high.

The digital two-sided HHC system 350 offers the faster transient response times of a two-sided HHC system relative to one-sided HHC systems and also offers reduced PWM asymmetry compared to the analog two-sided HHC system 250 shown in FIG. 2A by triggering transitions in CTLA 110A and CTLB 110B based on both the high side and the low side of VCR 155. In addition, the ramp generator 385 is included in the integrated circuit with the comparators 360A-B, PWM controller 370, and the remaining components of digital two-sided HHC system 350.

Figure 4A:
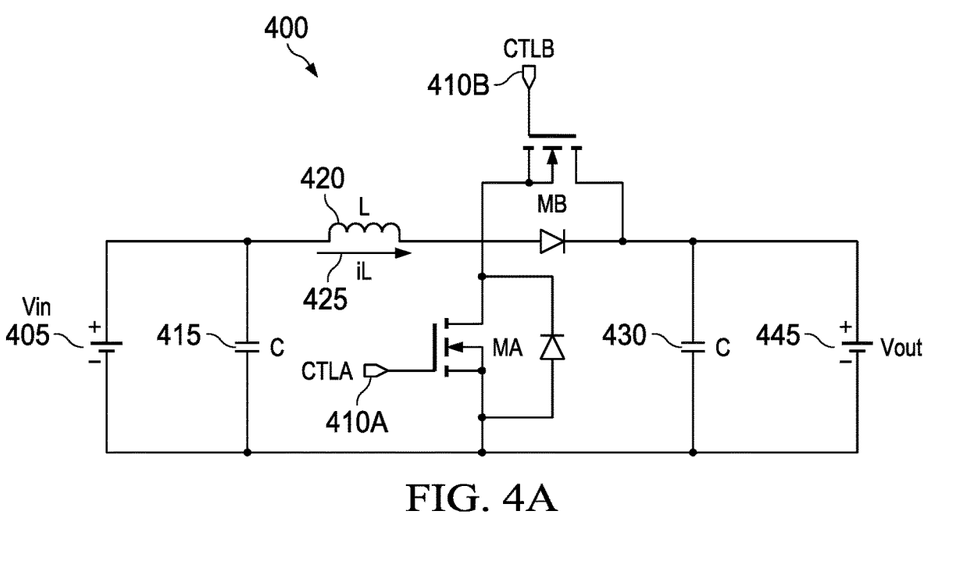
FIG. 4A shows a block diagram of an example peak current-mode control DC-DC converter for the two-sided HHC system shown in FIG. 3A.

The digital two-sided HHC system 350 shown in FIG. 3A can be used to support advanced topologies such as peak boost converters, peak buck converters, valley boost converters, valley buck converters, and the like. To illustrate, FIG. 4A shows a block diagram of an example peak current-mode control (PCMC) DC-DC converter 400 that can be controlled by the digital two-sided HHC system shown in FIG. 3A. The PCMC DC-DC converter 400 includes transistors MA and MB, capacitors C 415 and C 430, and inductor L 420. The transistors MA and MB are NMOS in this example. In other examples, one or more of MA and MB are PMOS or BJTs.

The capacitor C 415 has a first terminal coupled to a first terminal of the inductor L 420, and a second terminal. The input voltage Vin 405 is applied to the first and second terminals of the capacitor C 415 and the first terminal of the inductor L 420. The second terminal of the inductor L 420 is coupled to the drain terminal of MA and the source terminal of MB. A current iL 425 flows through the inductor L 420. The source terminal of MA is coupled to the second terminal of the capacitor C 415, and the gate terminal of MA is configured to receive the first control signal CTLA 410A. The drain terminal of MB is coupled to a first terminal of the capacitor C 430, and the gate terminal of MB is configured to receive the second control signal CTLB 410B. The capacitor C 430 has a second terminal coupled to the source terminal of MA and the second terminal of the capacitor C 415. The output voltage Vout 445 is taken across the capacitor C 430.

Figure 4B:
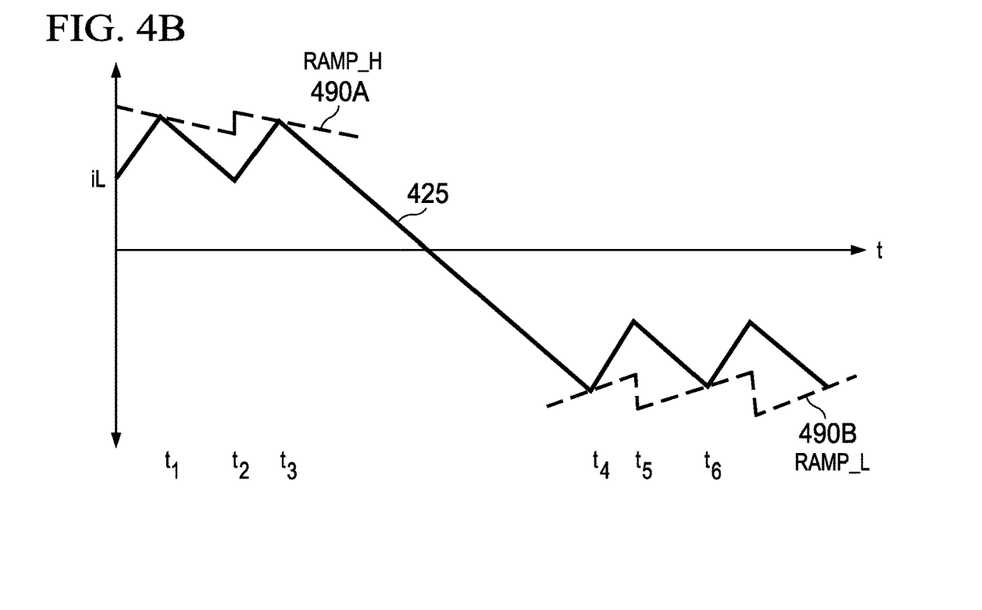
FIG. 4B shows waveforms of signals in the peak current-mode control DC-DC converter shown in FIG. 4A and the two-sided HHC system shown in FIG. 3A.

The digital two-sided HHC system 350 shown in FIG. 3A can be used to provide the control signals CTLA 410A and CTLB 410B. FIG. 4B shows waveforms of the current iL 425 through the inductor L 420 shown in the PCMC DC-DC converter 400 shown in FIG. 4A and the high side falling ramp RAMP_H 490A and the low side rising ramp RAMP_L 490B generated in the digital two-sided HHC system used to generate the control signals CTLA 410A and CTLB 410B.

At time t1, the current iL 425 intersects with the high side falling ramp RAMP_H 490A, and the control system generates the control signals CTLA 410A and CTLB 410B such that iL 425 decreases. At time t2, iL 425 increases again, and at time t3, iL 425 intersects the high side falling ramp RAMP_H 490A, and the control system generates the control signals CTLA 410A and CTLB 410B such that iL 425 decreases. At time t4, the current iL 425 intersects with the low side rising ramp RAMP_L 490B, and the control system generates the control signals CTLA 410A and CTLB 410B such that the current iL 425 increases. At time t5, the current iL 425 decreases again, and at time t6, iL 425 intersects with the low side rising ramp RAMP_L 490B, and the control system generates the control signals CTLA 410A and CTLB 410B such that the current iL 425 increases.

Figure 4C:
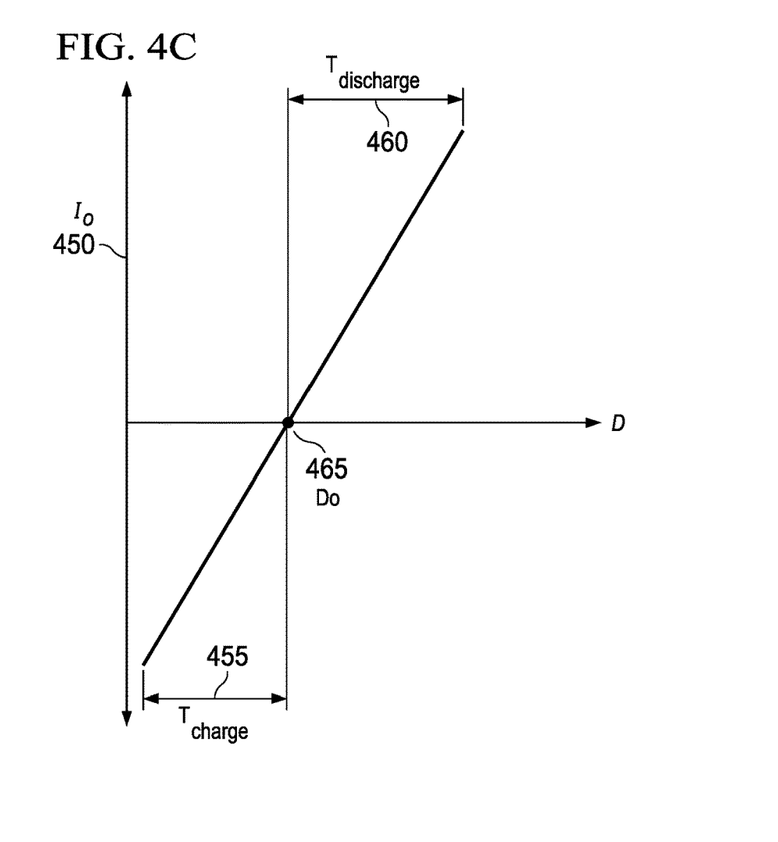
FIG. 4C shows a graph of the average current over duty cycle for the peak current-mode control DC-DC converter shown in FIG. 4A.

FIG. 4C shows a graph of the average current Io 450 over duty cycle D for the PCMC DC-DC converter 400 shown in FIG. 4A. During a first time period Tcharge 455, the capacitors C 415 and 430 are charged, and at the duty cycle Do 465, the average current Io 450 changes directions and the capacitors C 415 and 430 begin to discharge for a time period Tdischarge 460. The duty cycle Do 465 may be represented as:

$$Do\ 465 = 1 - \frac{Vin\ 405}{Vout\ 445}$$

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

As used herein, the terms "terminal", "node", "interconnection", "pin" and "lead" are used interchangeably. Unless specifically stated to the contrary, these terms are generally used to mean an interconnection between or a terminus of a device element, a circuit element, an integrated circuit, a device or other electronics or semiconductor component.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

While the use of particular transistors is described herein, other transistors (or equivalent devices) may be used instead. For example, a p-type metal-oxide-silicon field effect transistor ("MOSFET") may be used in place of an n-type MOSFET with little or no changes to the circuit. Furthermore, other types of transistors may be used (such as bipolar junction transistors (BJTs)).

Circuits described herein are reconfigurable to include additional or different components to provide functionality at least partially similar to functionality available prior to the component replacement. Components shown as resistors, unless otherwise stated, are generally representative of any one or more elements coupled in series and/or parallel to provide an amount of impedance represented by the resistor shown. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

Unless otherwise stated, "about," "approximately," or "substantially" preceding a value means+/−10 percent of the stated value. Modifications are possible in the described examples, and other examples are possible within the scope of the claims.

What is claimed is:

1. A system, comprising:
   a first comparator having a first positive input, a first negative input, a first control input, and a first output;
   a second comparator having a second positive input, a second negative input, a second control input, and a second output;
   a pulse-width modulation (PWM) controller coupled to the first and second outputs and the first and second control inputs and having a control output;
   a ramp generator having a first ramp output coupled to the first positive input and a second ramp output coupled to the second negative input;
   an analog-to-digital converter (ADC) having an ADC output;
   an adder having a positive input, a negative input coupled to the ADC output, and an adder output; and
   a voltage controller having an input coupled to the adder output and an output coupled to the ramp generator.

2. The system of claim 1, wherein the ramp generator is configured to generate a first ramp for the first comparator and a second ramp for the second comparator, wherein the first ramp is a high-side falling ramp, and wherein the second ramp is a low-side rising ramp.

3. The system of claim 2, wherein the ramp generator comprises:
   a first ramp generator having the first ramp output and configured to generate the first ramp for the first comparator; and
   a second ramp generator having the second ramp output and configured to generate the second ramp for the second comparator.

4. The system of claim 2, wherein the first and second ramps are offset by half a period T.

5. The system of claim 2, wherein a first control signal generated by the PWM controller and provided to the first control input causes the first ramp to reset, and wherein a second control signal generated by the PWM controller and provided to the second control input causes the second ramp to reset.

6. The system of claim 1, further comprising a voltage sensing circuit configured to provide an input voltage.

7. The system of claim 6, wherein the input voltage is a first input voltage, wherein the control output comprises a first control output and a second control output, the system further comprising:
a first transistor having a first control terminal coupled to the first control output, a first current terminal, and a second current terminal;
a second transistor having a second control terminal coupled to the second control output, a third current terminal coupled to the second current terminal, and a fourth current terminal;
a capacitor having a first capacitor terminal coupled to the fourth current terminal and a second capacitor terminal;
an inductor having a first inductor terminal coupled to the second and third current terminals and a second inductor terminal;
a transformer having a first input coupled to the second inductor terminal, a second input coupled to the second capacitor terminal, a first transformer output, a second transformer output, and a third transformer output;
a third transistor having a third control terminal, a fifth current terminal coupled to the first transformer output, and a sixth current terminal; and
a fourth transistor having a fourth control terminal, a seventh current terminal coupled to the second transformer output, and an eighth current terminal coupled to the sixth current terminal.

8. The system of claim 7, wherein the transformer is a center-tap transformer.

9. The system of claim 7, wherein
the analog-to-digital converter (ADC) is configured to receive a voltage across the third transformer output and the sixth and eighth current terminals.

10. The system of claim 9, wherein:
The ramp generator is configured to generate a first ramp for the first comparator and a second ramp for the second comparator; and
the voltage controller is configured to indicate a first initial frequency for the first ramp and a second initial frequency for the second ramp.

11. A device, comprising:
a first comparator having a first input configured to receive a first ramp and a second input configured to receive an input voltage, wherein the first comparator is configured to generate a first triggering signal;
a second comparator having a first input configured to receive the input voltage and a second input configured to receive a second ramp, wherein the second comparator is configured to generate a second triggering signal;
a pulse-width modulation (PWM) controller configured to generate a first control signal and a second control signal based on the first and second triggering signals;
a ramp generator configured to generate the first ramp for the first comparator and the second ramp for the second comparator;
an analog-to-digital converter (ADC) having an ADC output;
an adder having a first input, a second input coupled to the ADC output, and an adder output; and
a voltage controller having an input coupled to the adder output and an output coupled to the ramp generator.

12. The device of claim 11, wherein the first ramp is a high-side falling ramp and the second ramp is a low-side rising ramp.

13. The device of claim 12, wherein the first and second ramps are offset by half a period T.

14. The device of claim 11, wherein:
the first comparator further comprises a first control input configured to receive a first feedback signal; and
the second comparator further comprises a second control input configured to receive a second feedback signal.

15. The device of claim 14, wherein the PWM controller is further configured to generate the first feedback signal for the first comparator and the second feedback signal for the second comparator.

16. The device of claim 11, wherein the input voltage is a first input voltage, the device further comprising:
a first transistor having a control terminal configured to receive the first control signal, a first current terminal, and a second current terminal;
a second transistor having a control terminal configured to receive the second control signal, a third current terminal coupled to the second current terminal, and a fourth current terminal, wherein the first and fourth current terminals are configured to receive a second input voltage;
a transformer having a first transformer input, a second transformer input, a first transformer output, a second transformer output, and a third transformer output;
a capacitor coupled between the fourth current terminal and the second transformer input;
a voltage sensing circuit configured to measure the first input voltage across the capacitor;
an inductor coupled between the second and third current terminals and the second transformer input;
a third transistor having a control terminal configured to receive a biasing voltage, a fifth current terminal coupled to the first transformer output, and a sixth current terminal; and
a fourth transistor having a control terminal configured to receive the biasing voltage, a seventh current terminal coupled to the second transformer output, and an eighth current terminal coupled to the sixth current terminal.

17. The device of claim 16, wherein the transformer is a center-tap transformer.

18. The device of claim 11, further comprising:
a first transistor having a control terminal configured to receive the first control signal, a first current terminal, and a second current terminal;
a second transistor having a control terminal configured to receive the second control signal, a third current terminal, and a fourth current terminal coupled to the first current terminal;
a capacitor having a first capacitor terminal coupled to the second current terminal and a second capacitor terminal;
an inductor having a first inductor terminal coupled to the second capacitor terminal and a second inductor terminal coupled to the first and fourth current terminals; and
a voltage sensing circuit configured to measure a voltage across the capacitor.

19. An apparatus, comprising:
a first comparator configured to receive a first ramp and generate a first triggering signal;

a second comparator configured to receive a second ramp and generate a second triggering signal, wherein the first ramp and the second ramp are offset by half a period T;
a pulse-width modulation (PWM) controller configured to generate a first control signal and a second control signal based on the first and second triggering signals;
a ramp generator configured to generate the first ramp and the second ramp;
an analog-to-digital converter (ADC) having an ADC output;
an adder having a positive input, a negative input coupled to the ADC output, and an adder output; and
a voltage controller having an input coupled to the adder output and an output coupled to the ramp generator.

20. The apparatus of claim 19, wherein:
the first comparator further comprises a first control input configured to receive a first feedback signal; and
the second comparator further comprises a second control input configured to receive a second feedback signal.

21. The apparatus of claim 20, wherein the PWM controller is further configured to generate the first feedback signal for the first comparator and the second feedback signal for the second comparator.

* * * * *